(12) United States Patent
Lin et al.

(10) Patent No.: US 6,664,011 B2
(45) Date of Patent: Dec. 16, 2003

(54) HOLE PRINTING BY PACKING AND UNPACKING USING ALTERNATING PHASE-SHIFTING MASKS

(75) Inventors: Burn-Jeng Lin, Hsin chu (TW); Shinn-Sheng Yu, Taichung (TW); Bang-Chein Ho, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 222 days.

(21) Appl. No.: 10/005,806

(22) Filed: Dec. 5, 2001

(65) Prior Publication Data

US 2003/0104286 A1 Jun. 5, 2003

(51) Int. Cl.$^7$ .............................. G03F 9/00; G03C 5/00
(52) U.S. Cl. ........................ 430/5; 430/312; 430/313; 430/315; 430/394
(58) Field of Search ........................... 430/5, 312, 313, 430/315, 394

(56) References Cited

U.S. PATENT DOCUMENTS

| | | | |
|---|---|---|---|
| 5,308,741 A | 5/1994 | Kemp | 430/312 |
| 5,432,044 A | 7/1995 | Shimizu | 430/269 |
| 5,573,634 A | 11/1996 | Ham | 156/659.11 |
| 6,134,008 A | 10/2000 | Nakao | 356/363 |
| 6,162,736 A | 12/2000 | Nakao | 438/736 |
| 6,238,850 B1 | 5/2001 | Bula et al. | 430/394 |

*Primary Examiner*—Christopher G. Young
(74) *Attorney, Agent, or Firm*—George O. Saile; Stephen B. Ackerman

(57) ABSTRACT

A new method is provided for the creation of contact holes. The DOF and MEF of closely packed holes can be improved using Alternating Phase Shifting Mask (Alt PSM) for the exposure of the holes. However, Alt PSM are dependent on hole density or hole separation and are less effective where holes are relatively further separated from each other. In order to improve DOF and MEF performance for the creation of holes, the invention adds extra holes to a given pattern of contact holes on the surface of a first mask, thus densifying the pattern of holes on the first mask and therefore reducing the range of the hole-diameter to hole separation ratio. The pattern of added holes is alternating in phase with the pattern of desired holes. The added holes will be filled up using a second mask.

61 Claims, 12 Drawing Sheets

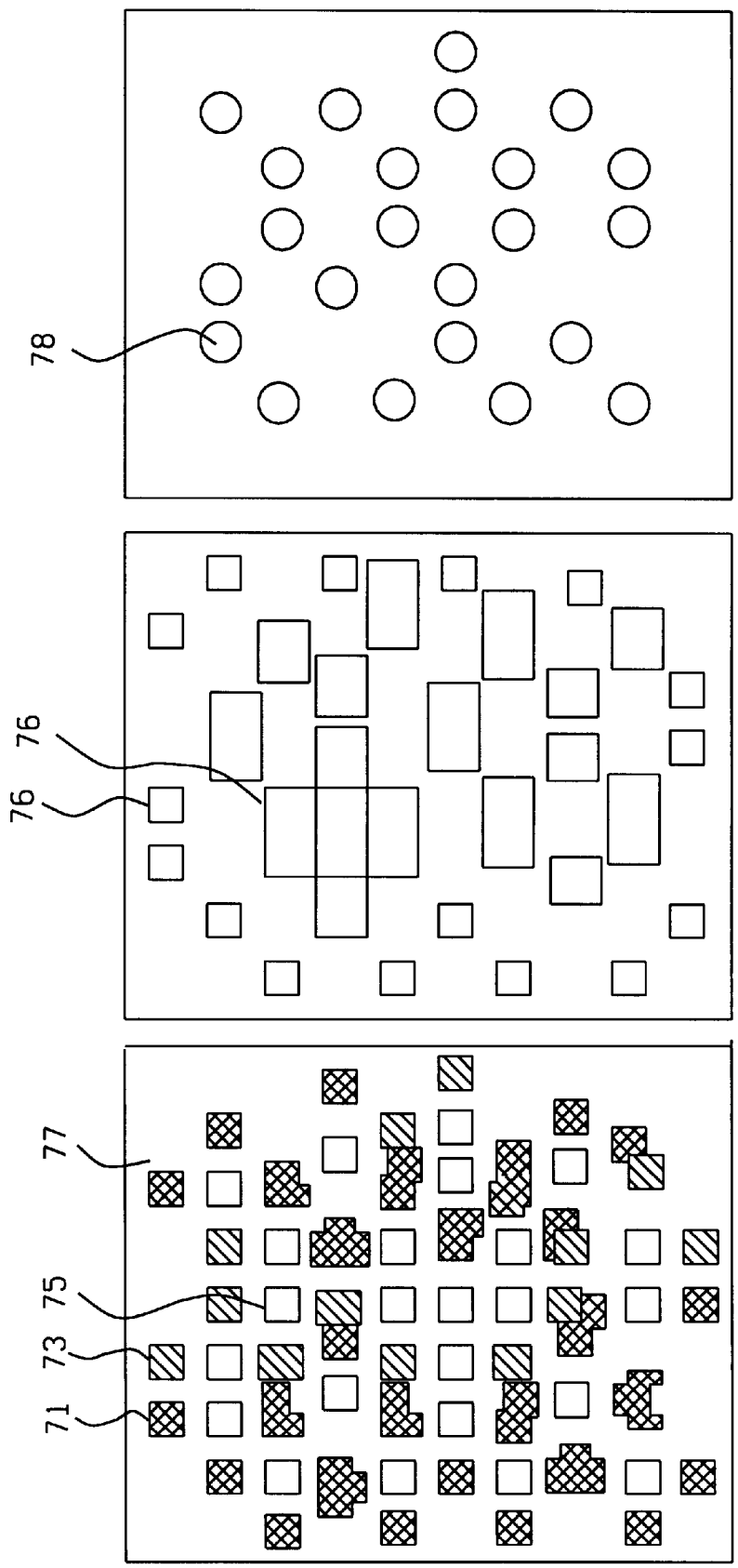

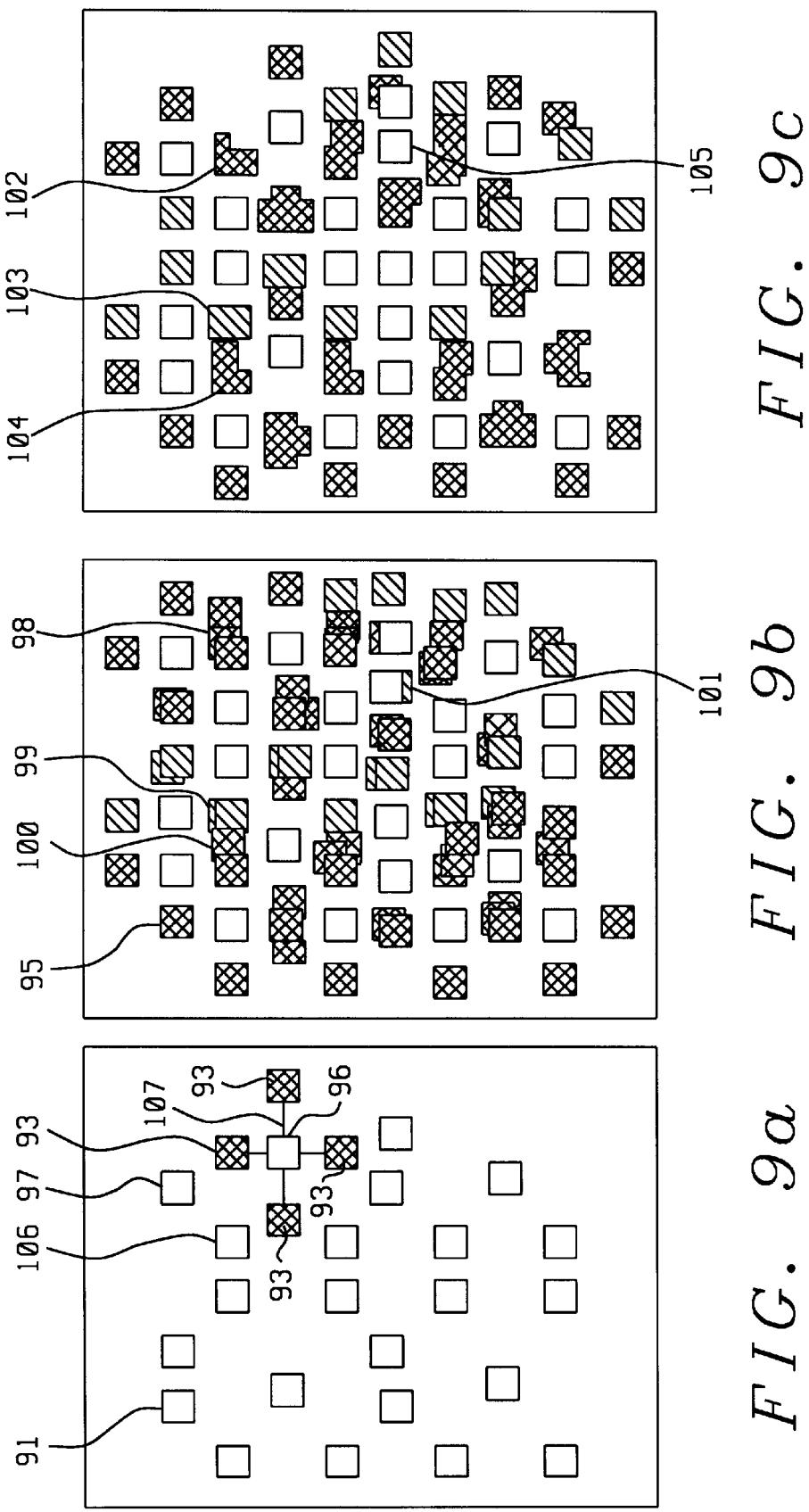

HOLE PRINTING BY PACKING AND UNPACKING USING ALTERNATING PHASE-SHIFTING MASKS

BACKGROUND OF THE INVENTION (1) Field of the Invention

The invention relates to the fabrication of integrated circuit devices, and more particularly, to a method for improved hole creation by packing and unpacking of hole patterns and by using alternating phase-shifting masks.

(2) Description of the Prior Art

The creation of semiconductor devices, typically created in or on the surface of a silicon substrate, essentially comprises the creation of numerous interacting patterns and the creation of interconnects that electrically interconnect selected patterns for the creation of operational devices. Device interconnects comprise patterns of interconnect lines, required contact holes or vias are created to connect overlying interconnect lines.

Since device features are transposed from a mask into a semiconductor surface using photolithographic imaging processes, which depends on the transfer of photo energy from a source to a target surface, it is to be expected that, for target features that are created in very close proximity to each other, the transfer of photo energy interacts for very these closely spaced device features, most commonly interconnect lines or contact holes having sub-micron spacing between adjacent features.

A common measure for the occurrence of such interaction are applications where the critical dimensions of the layout of the Integrated Circuit (IC) approach the resolution limit of the lithography equipment. For such applications, proximity effects begin to influence the manner in which mask images are transferred to target surfaces. This interaction imposes limitations on the proximity of adjacent device features, these limitations are referred to as Critical Dimensions (CD) of a design and device layout. This CD is commonly defined as the smallest spacing or the smallest line width of an interconnect line that can be achieved between adjacent interconnect lines. This CD in current technology is approaching the 0.1 to 0.2 $\mu$m range.

U.S. Pat. No. 5,573,634 (Ham) shows a contact hole process using a double exposure photoresist process.

U.S. Pat. No. 5,308,741 (Kemp) shows a double exposure process with mask shifting and phase shifting.

U.S. Pat. No. 5,432,044 (Shimizu) shows a double exposure process with a phase shift masks (PSM).

U.S. Pat. No. 6,238,850 (Bula et al.), U.S. Pat. No. 6,162,736 (Nakao), and U.S. Pat. No. 6,134,008 (Nakao) reveal related processes.

SUMMARY OF THE INVENTION

A principle objective of the invention is to provide a method of creating contact holes using a packing and unpacking procedure, further applying a phase-shift mask.

Another objective of the invention is to provide a method of creating contact holes of sub-micron dimensions whereby the provided method is not limited to holes of one hole-diameter to hole-distance ratio.

Another objective of the invention is to provide a method of creating contact holes of sub-micron dimensions whereby the range of the ratio of hole-diameter to hole-distance is narrowed, allowing for the creation of more densely packed holes.

Another objective of the invention is to provide improved Depth Of Focus (DOF) during the creation of contact holes.

Yet another objective of the invention is to improve a Mask Error Factor (MEF) associated with the creation of contact holes.

In accordance with the objectives of the invention a new method is provided for the creation of contact holes. The DOF and MEF of closely packed holes can be improved using Alternating Phase Shifting Mask (Alt PSM) for the exposure of the holes. However, Alt PSM are dependent on hole density or hole separation and are less effective where holes are relatively further separated from each other. In order to improve DOF and MEF performance for the creation of holes, the invention adds extra holes to a given pattern of contact holes on the surface of a first mask, thus densifying the pattern of holes on the first mask and therefore reducing the range of the hole-diameter to hole separation ratio. The pattern of added holes is alternating in phase with the pattern of desired holes. The added holes will be filled up using a second mask.

BRIEF DESCRIPTION OF THE DRAWINGS

FIGS. 7a through 7c show the application of Alt PSM for irregularly placed holes and unpacking by designating holes for back filling.

FIGS. 9a through 9c show a sequence of mask creation, from an original layout to a packed mask.

DESCRIPTION OF THE PREFERRED EMBODIMENTS

Figure 1C:
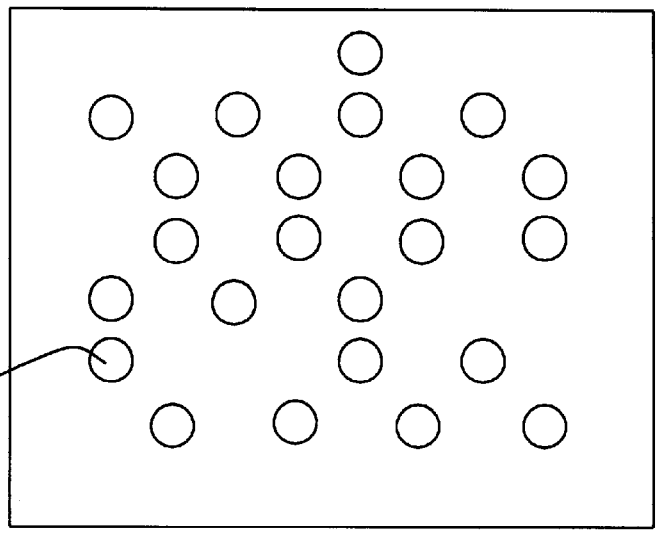
FIGS. 1a through 1c show the application of an Alt PSM of regularly packed holes and an unpacking mask to designate the unwanted holes for back fill.

A number of limiting factors are encountered in exposing a pattern that is contained in a photolithographic mask onto a semiconductor surface, such as the surface of a photosensitive polymer, which is more commonly referred to as a photoresist. One of these limitations is the exposure tool resolution, which is defined as the smallest feature that an exposure tool can repeatedly expose onto a surface. Another limiting factor is the so-called proximity effect, highlighted above, that are known to result from optical diffraction in the projection system. This optical diffraction causes adjacent features to mutually interact, an interaction that is pattern-dependent, making this interaction even more difficult to counteract. The proximity effect causes lines of equal dimensions, which are placed in proximity to different features of exposure, to be developed having different dimensions. This is particularly prone to occur where line densities vary, a variation that extends from exposing a single isolated line to exposing densely spaced lines. It is basic that interconnect lines must be created that have identical dimensions by using one exposure pattern.

Addressed at this time are the techniques that are required to create openings on a semiconductor surface such as the surface of a layer of photoresist or the surface of a semiconductor substrate. The invention addresses problems that are typically caused in imaging contact holes. In past practices, these problems have been addressed by off-axis illumination in the form of annular, quadruple of dipole configurations. This method however is highly dependent on the density of the created images and can mostly be optimized for only one density of images at a time. The invention provides a method of creating contact holes that improves Depth Of Focus (DOF) and a Mask Error Factor (MEF) in effect during the creation of the contact holes.

In applying conventional micro-photolithography with a reduction of the feature size below 0.4 lambda/NA, where lambda is the actinic wavelength and NA is the numerical aperture of the imaging lens, the depth of focus (DOF) is in the order of 0.21 lambda/NHA, where NHA is the numerical half aperture. To create 0.1 $\mu$m contact holes, using a wavelength of 193 nm and a NA of 0.65, the feature size is 0.34 lambda/NA and the DOF is about 0.32 $\mu$m. In addition, the Mask Error Factor (MEF), which is defined as the ratio between the incremental change of the image dimension and the incremental change of the object dimension on the mask, is in the order of 4.0. Both indicated values of DOF and MEF are unacceptable for the creation of contact holes for sub-micron and deep-sub-micron semiconductor devices. The invention provides a method for the improvement of both DOF and MEF for such contact holes.

Methods have been provided to improve the DOF of closely packed contact holes with off-axis illumination. This off-axis illumination can be applied in annular, quadruple or bipolar configurations but the location of these configurations can be optimized only for a specific packing density. For example, only the image of holes with a hole-diameter to hole-separation ratio of 1:1 is optimized. After this optimization has been implemented for the 1:1 ratio, holes with a ratio of 1:2 benefit to a lesser degree than the 1:1 ratio holes. This decrease in benefit is even more pronounced for holes that are further separated, which includes isolated holes. Alternately, holes may be optimized for a hole-diameter to hole-separation ratio of 1:2, with however equally detrimental results for holes that are packed closer and holes that are packed less tightly than is the case for the optimized holes.

The invention addresses these concerns by providing two masks. A first mask is a packed mask that comprises holes packed with a single hole diameter to hole separation ratio. The ratio of 1:1 has been used as an example but any ratio that is within the effective range of the Alt PSM can be used. A second mask comprises patterns of slightly larger holes than the holes in the first mask, the holes provided in the second mask align with the desired holes. The first mask is exposed before the unpacking mask is exposed to delineate both types of holes. The unpacking mask is used to selectively cover the padding holes, resulting in a final image.

Keeping the above-indicated method of the invention in mind, the invention can be summarized as follows:

the invention provides a first mask comprising desired holes and padding holes, the desired holes and the padding holes alternate in phase the invention provides a second mask comprising unpacking features that align with the padding holes of the first mask, the unpacking features of the second mask are slightly larger than the padding holes of the first mask the invention provides a third mask comprising unpacking features that align with the desired holes of the first mask, the unpacking features of the third mask are slightly larger than the padding holes of the first mask the background field of the first mask can be opaque, the desired holes and the padding holes of the first mask can be transparent the background field of the first mask can be transparent, the desired holes and the padding holes of the first mask can be opaque the background field of the second mask can be opaque, the unpacking features of the second mask can be transparent the background field of the second mask can be transparent, the unpacking features of the second mask can be opaque the background field of the third mask can be opaque, the unpacking features of the third mask can be transparent the background field of the second mask can be transparent, the unpacking features of the third mask can be opaque the alternating phase of the Alt PSM is about 180 degrees processes of exposing semiconductor surfaces, typically the surface of a layer of photoresist, can be performed the processes of exposure can be extended by hardening or cross-linking exposed surfaces multiple layers of photoresist can be applied and patterns can be created in for instance a first layer of photoresist and a second layer of photoresist; these layer of photoresist may comprise silicon images that are created using processes of exposure can be transferred to overlying layers of for instance photoresist positive and negative layers of photoresist may be used dual-polarity layers of photoresist may be used exposed patterns of holes may be etched etched patterns of holes may be back-filled a padded hole may be created by adding four additional holes of opposite phase to four sides of each desired hole; these additional holes may be at equal distance from each desired hole, this equal distance may be related to the size of the corresponding desired hole; these additional holes may be of the same size as the desired hole padded holes may include larger holes that contain all additional holes of the same phase additional holes that overlap another desired hole may be excluded.

The invention is now further described using FIGS. 1a through 9c. This effort will be facilitated by restating the principle on which the invention is based, that is the invention adds extra holes to a given pattern of contact holes on the surface of a first mask, thus densifying the pattern of holes on the first mask and therefore narrowing the range of the hole-diameter to hole separation ratio. The holes that are added to the first mask may be phase-shifted holes or holes to which no phase-shifter is applied. The added holes will be filled up using a second mask.

Figure 1B:
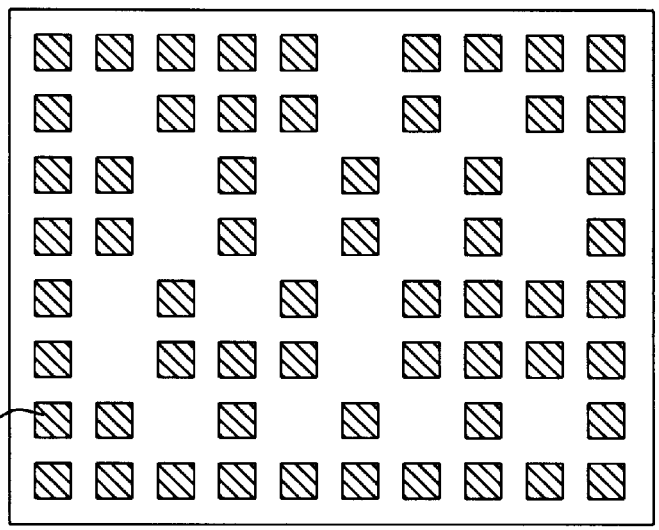
Figure 1A:
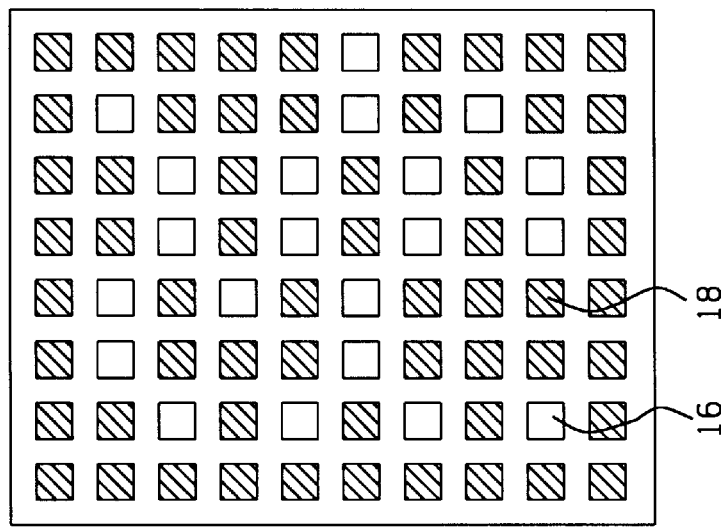

Referring specifically to FIGS. 1a through 1c, there is shown the application of an Alt PSM of regularly packed holes and an unpacking mask to designate the unwanted holes for back fill, as follows:

- 10, FIG. 1a, shows a packed mask
- 16, one of the holes that is provided on the packed mask 10; no phase-shifter is applied to this hole
- 18, one of the phase-shifted holes that is provided on the packed mask
- 12, FIG. 1b, shows an unpacking mask, designating the unwanted holes to protect the unwanted holes from back filling; holes 11 (provided on the unpacking mask 12) are of larger dimensions than the holes 16 and 18 (provided on the packed mask 10)
- 14, FIG. 1c, the final image that is obtained by applying the packed mask and the unpacked mask; desired holes 13 are created.

Figure 2A:
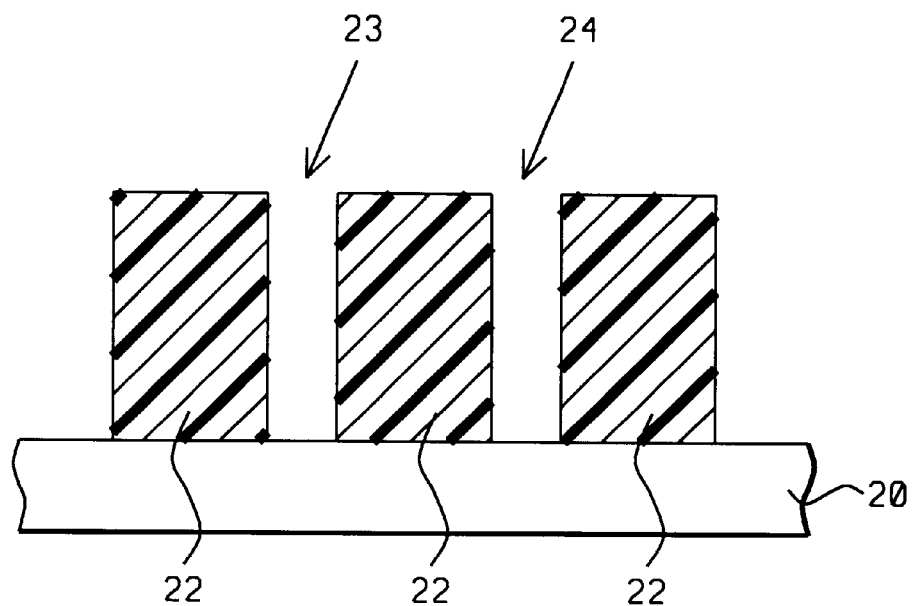
FIGS. 2a through 2d show Packing and Unpacking (PAU) with two coatings of photoresist.
Figure 2B:
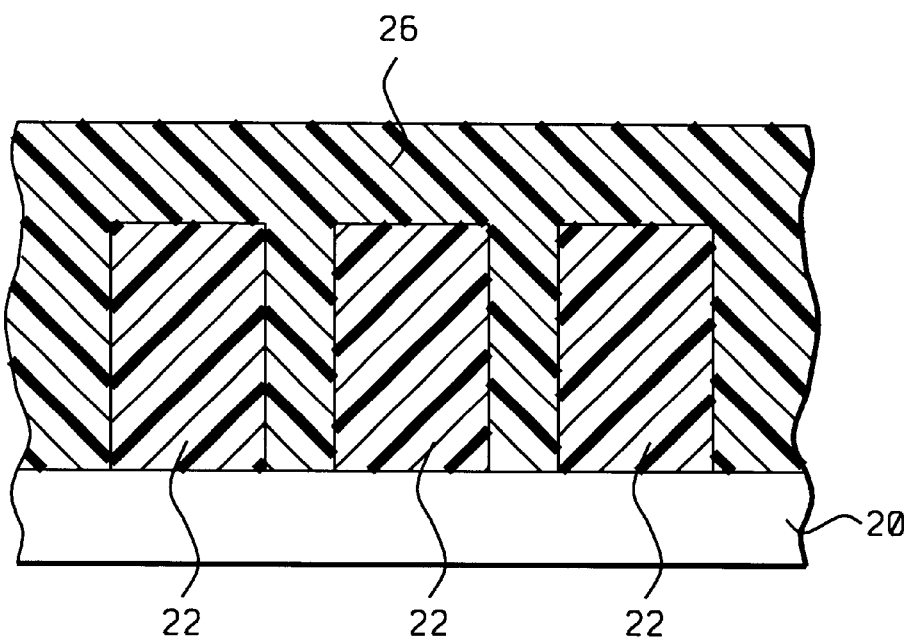
Figure 2C:
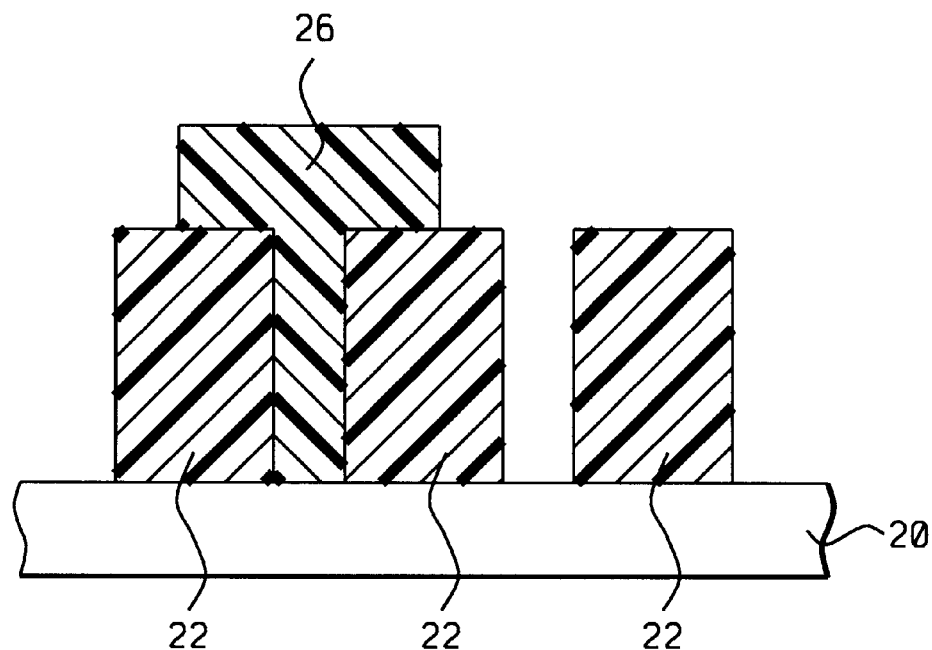
Figure 2D:
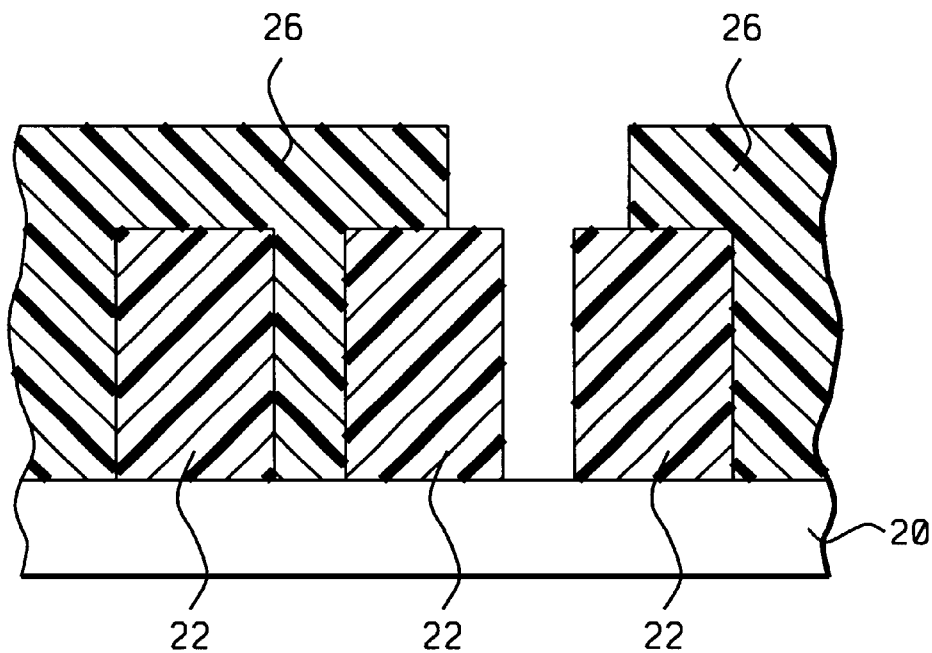

FIGS. 2a through 2d show Packing and Unpacking (PAU) with two coatings of photoresist, as follows:

- 20, FIG. 2a, a semiconductor surface, typically the surface of a substrate;
- 22, a first layer of photoresist; the first layer of photoresist has been patterned using the packed mask
- 23, a padded hole created through the first layer 22 of photoresist
- 24, a desired hole created through the first layer 22 of photoresist
- 26, FIG. 2b, a second layer of photoresist deposited over the surface of the patterned first layer 22 of photoresist, filling openings 23 and 24
- 25, FIG. 2c, a first unpack, leaving photoresist in place covering padded opening 23
- 27, FIG. 2d, a second unpack, leaving background layer of photoresist in place.

Figure 3C:
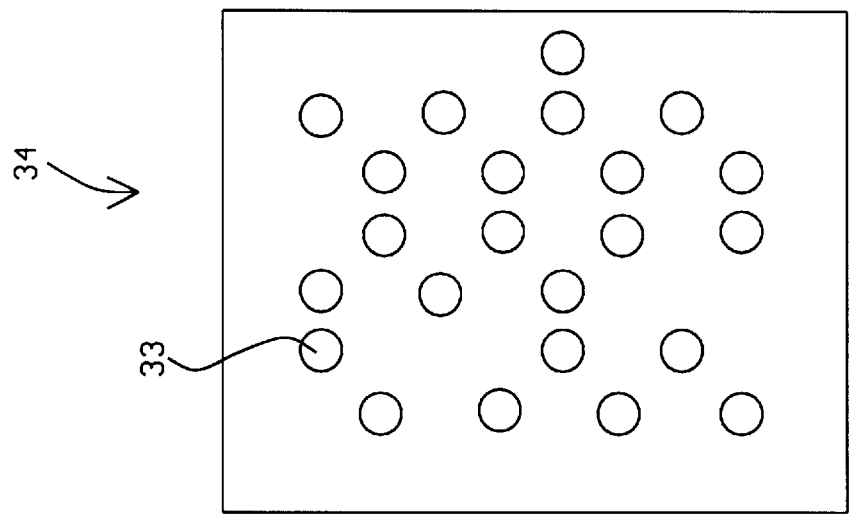
FIGS. 3a through 3c show the application of an Alt PSM of regularly packed holes and an unpacking mask to designate the desired holes and protecting the desired holed from back fill.
Figure 3B:
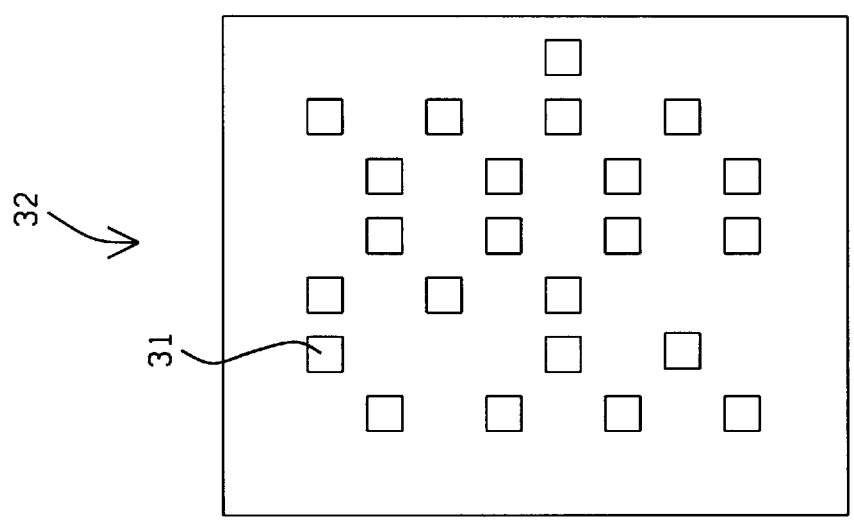
Figure 3A:
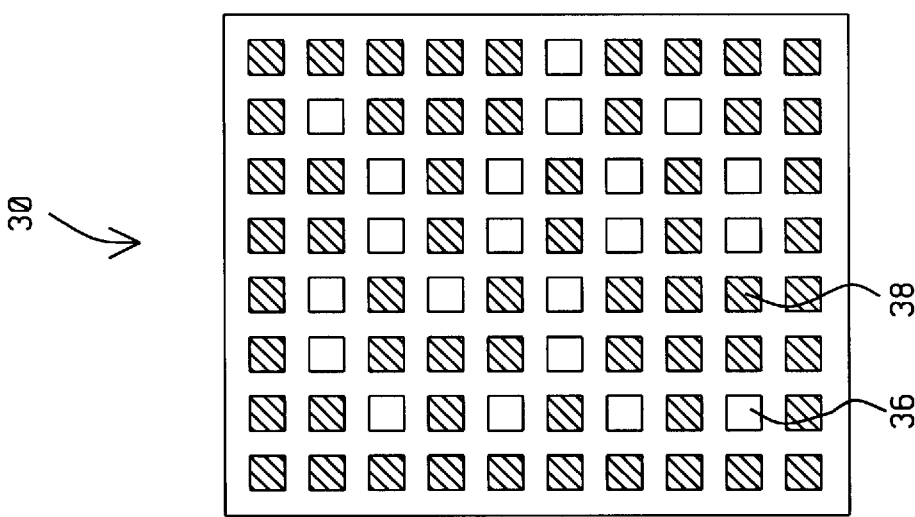

FIGS. 3a through 3c show the application of an Alt PSM of regularly packed holes and an unpacking mask to designate the desired holes and protecting the desired holed from back fill. It must be pointed out that FIGS. 3a through 3c in other respects are identical to FIGS. 1a through 1c, as follows: unpacking mask to designate the unwanted holes for back fill, as follows:

- 30, FIG. 3a, shows a packed mask
- 36, one of the holes that is provided on the packed mask 10; no phase-shifter is applied to this hole
- 38, one of the phase-shifted holes that is provided on the packed mask
- 32, FIG. 3b, shows an unpacking mask, designating the desired holes to protect the desired holes from back filling; holes 31 of larger dimensions than the holes 36 and 38 that are shown on the packed mask 30 are provided on the unpacking mask 32
- 34, FIG. 3c, the final image that is obtained by applying the packed mask and the unpacked mask; desired holes 33 are created.

Figure 4A:
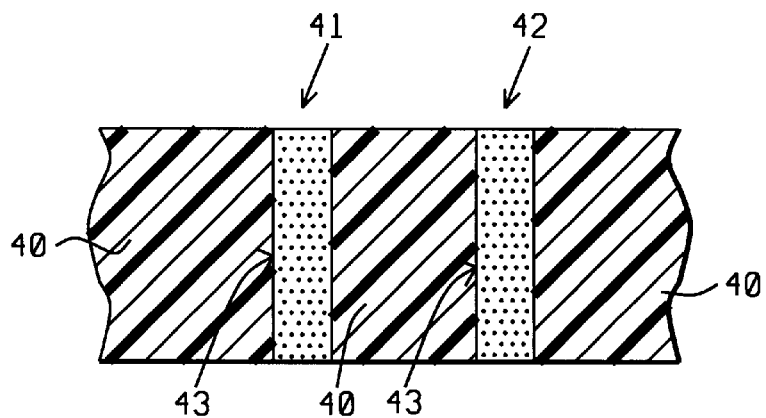
FIGS. 4a through 4c show PAU with one coating of photoresist, using dual polarity photoresist.
Figure 4B:
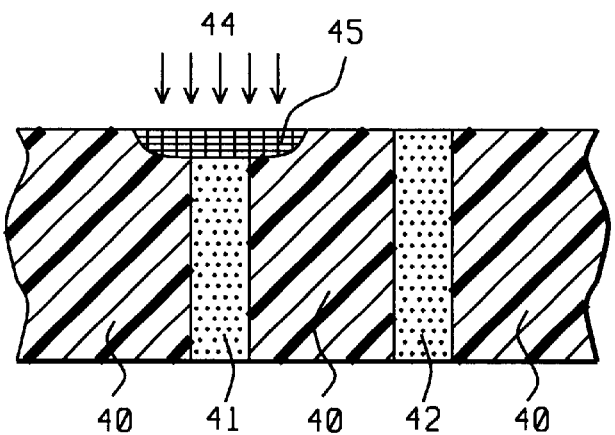
Figure 4C:
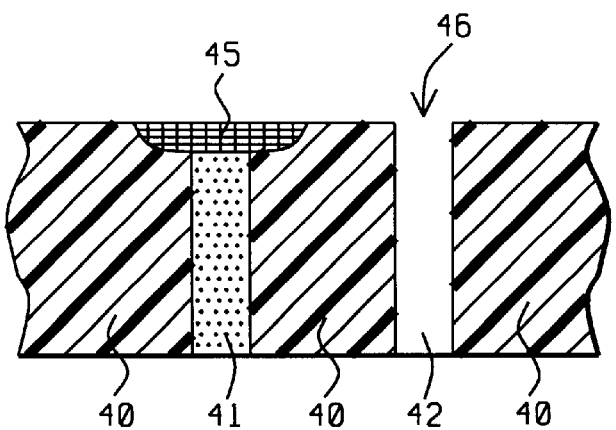

FIGS. 4a through 4c show the application of the PAU principle as applied to one coating of photoresist, using dual polarity photoresist, as follows:

- 40, FIG. 4a, a layer of photoresist
- 41, a padded hole, created as a latent image in the layer 40 of photoresist
- 42, a desired hole, created as a latent image in the layer 40 of photoresist
- 44, FIG. 4b, a cross linking exposure that is selectively applied to the surface of the latent image 41 of the padded hole
- 45, a layer of cross linked photoresist
- 46, FIG. 4c, a desired hole created through the layer 40 of photoresist.

Figure 5A:
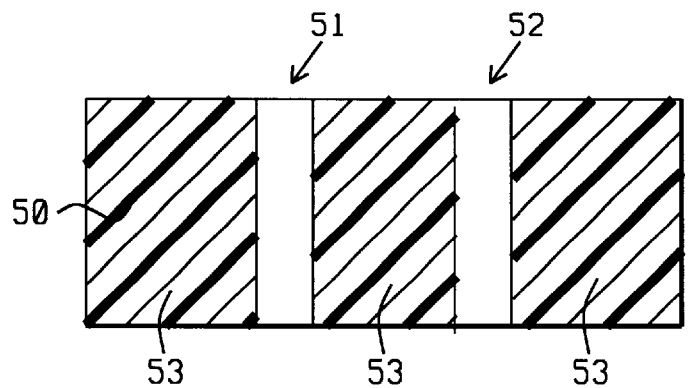
FIGS. 5a through 5c show PAU with one coating of photoresist, using negative photoresist.
Figure 5B:
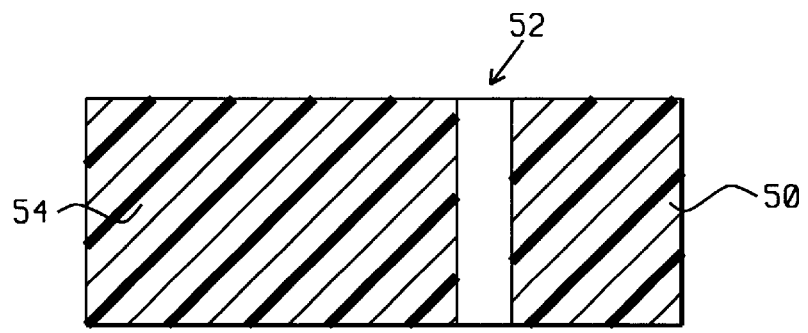
Figure 5C:
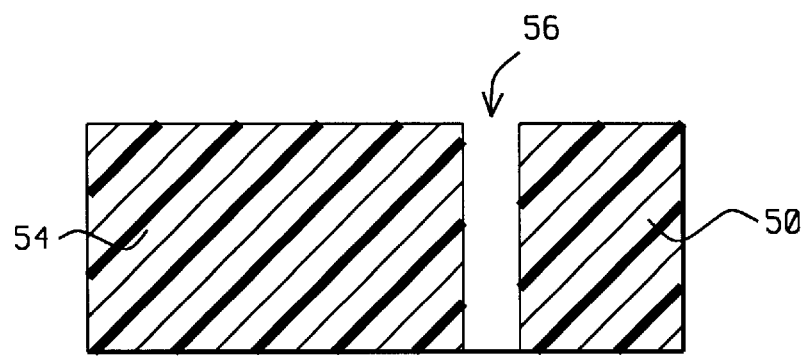

FIGS. 5a through 5c show the application of the PAU principle as applied to one coating of photoresist, using negative photoresist, as follows:

- 50, FIG. 5a, a layer of negative photoresist
- 51, a padded hole
- 52, a desired hole
- 53, latent images of the padded and desired holes created by applying a first exposure of the layer 50 of negative photoresist
- 54, FIG. 5b, the layer of photoresist where latent images are partially removed
- 55, a second exposure, and
- 56, FIG. 5c, a desired hole created through the layer 50 of negative photoresist.

Figure 6A:
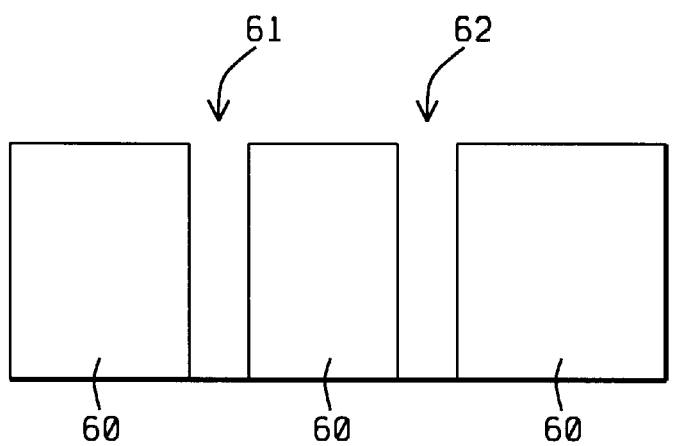
FIGS. 6a through 6c show PAU with two coatings of insulation film.
Figure 6B:
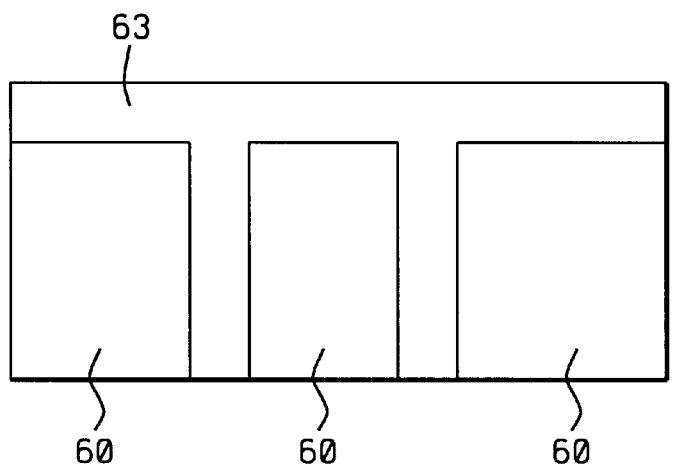
Figure 6C:
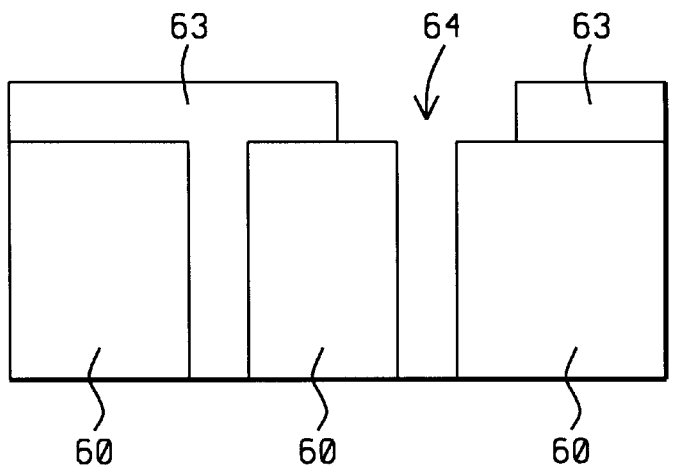

FIGS. 6a through 6c show the application of the PAU principle using two coatings of insulation film, as follows:

- 60, FIG. 6a, a first layer of insulating material
- 61, a padded hole created through the first layer 60 of insulating material
- 62, a desired hole created through the first layer 60 of insulating material
- 63, FIG. 6b, a second layer of insulating material deposited over the surface of the first layer 60 of insulating material, filling holes 61 and 62 that have been created through the first layer 60 of insulating material
- 64, FIG. 6c, the second layer 63 of insulating material has been partially removed, exposing the desired opening 64.

FIGS. 7a through 7c show the application of Alt PSM for irregularly placed holes and unpacking by designating the padding holes for back filling. The views that are shown in FIGS. 7a through 7c are essentially the same as those shown under FIGS. 1a through 1c with as notably difference that the latter FIGS. 1a through 1c showed regularly packed holes while FIGS. 7a through 7c shows irregularly packed holes, as follows:

- 70, FIG. 7a, a packed mask
- 71, a phase-shifted padding hole
- 73, a padding hole
- 75, a phase-shifted desired hole
- 77, a desired hole
- 72, FIG. 7b, an unpacking mask
- 76, unpacking features, designating the padding holes for back filling, provided on the unpacking mask 72
- 74, FIG. 7c, the final image, and
- 78, openings of the final image.

Figure 8C:
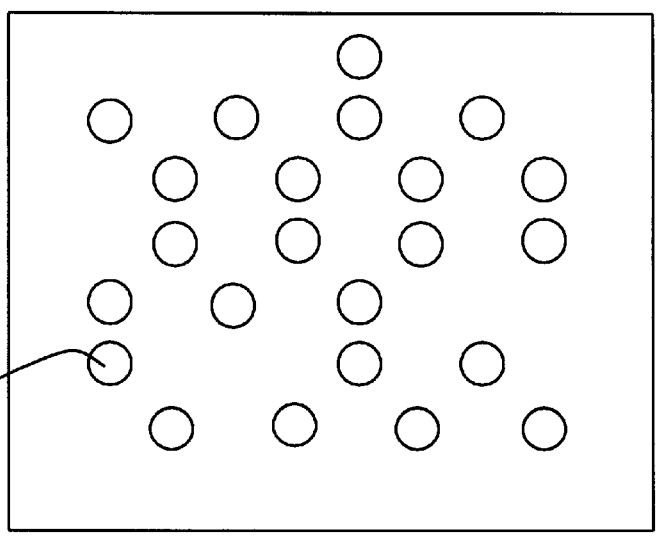
FIGS. 8a through 8c show the application of Alt PSM for irregularly placed holes and unpacking by designating holes for protection from back filling.
Figure 8B:
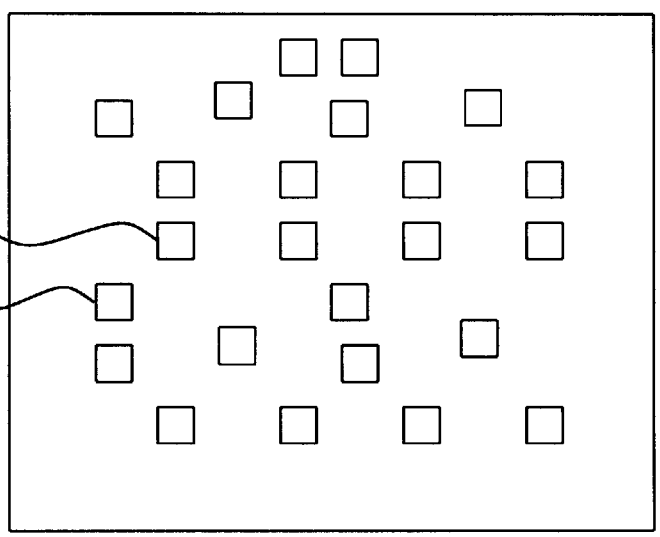
Figure 8A:
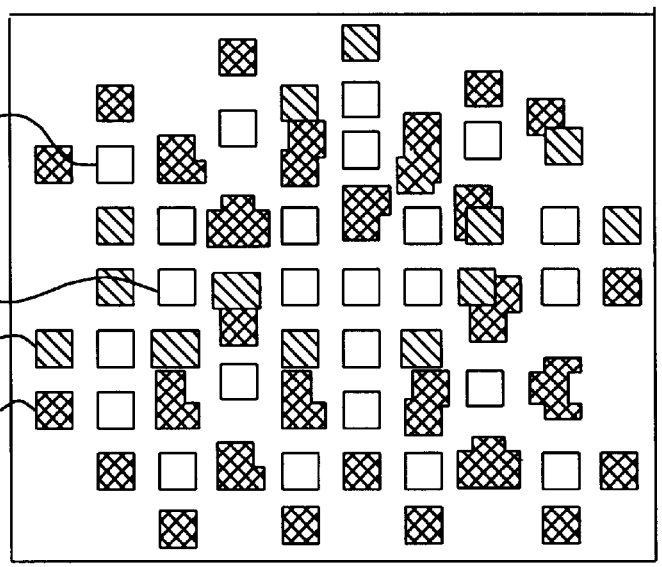

FIGS. 8a through 8c show the application of Alt PSM for irregularly placed holes and unpacking by designating the desired for protection from back filling; it must be pointed out that FIGS. 8a through 8c in other aspects is identical to FIGS. 7a through 7c, as follows:

- 80, FIG. 7a, a packed mask
- 81, a phase-shifted padding hole
- 83, a padding hole
- 85, a phase-shifted desired hole
- 87, a desired hole
- 82, FIG. 7b, an unpacking mask
- 86, unpacking features, protecting the padding holes from back filling, provided on the unpacking mask 72

84, FIG. 7c, the final image, and

88, openings of the final image.

FIGS. 9a through 9c show a sequence of mask creation, from an original layout of desired holes to a packed mask, as follows:

90, FIG. 9a, a pattern of desired holes

91, a desired hole

93, phase-shifted padded holes

92, FIG. 9b, added padding holes

94, FIG. 9c, combined padding holes

95, phase-shifted padded hole.

All other elements that have been highlighted in FIGS. 9a through 9c will be explained at a later time under processing examples that will be given following.

PAU with two resist coatings will first be discussed in further detail. FIGS. 2a through 2c show the two-resist coating process to perform PAU. The first layer of photoresist is exposed with the packed mask and developed as usual. A compatible second layer of photoresist is coated on the delineated first layer of photoresist without affecting the first layer of photoresist. For some layers of photoresist, in order to preserve the image of the first layer of photoresist, hardening and/or cross-linking of the image of the first layer of photoresist is desirable. A dependable method to obtain a stable image of the first layer of photoresist is the use of a bi-layer resist system. The bottom layer of a bi-layer resist system is first cross-linked. Then, an imaging layer is coated on it. In most cases, the imaging layer contains an element that forms a non-volatile compound upon $O_2$ RIE, such as Si. The bottom layer is subsequently delineated with etching and serves as the first layer resist image. Either positive or negative resist may be used for the second layer.

When a positive resist is chosen for the second layer, a light-field unpacking mask based on the padding holes results in coverage of the padding holes while a dark-field unpacking mask based on the desired holes results in coverage of the background as shown in FIGS. 1a through 1c.

When a negative resist is chosen, a dark-field unpacking mask based on the padding holes exposes the second layer of photoresist at the padding holes to make the padding holes insoluble in the resist developer, resulting in coverage of the padding holes. Alternately, a light-field unpacking mask based on the desired holes exposes the negative second layer of photoresist in all areas except where the desired holes are and results in coverage of the background. These situations are shown in FIGS. 3a through 3c.

PAU with a single resist is discussed next. PAU is not limited to using two resist coatings. Two examples are shown in FIGS. 4a through 4c and 5a through 5c respectively. FIGS. 4a through 4c show the PAU process with a single layer of dual-polarity resist. The dual polarity resist exhibits positive resist characteristics with normal exposure. It behaves like a negative resist with a higher energy exposure or dosage. Hence, one exposes the packed mask normally. Then the unpacking mask is exposed with a higher energy or dosage. Only the surface of this resist needs to be made insoluble by the second exposure. After development, only the desired holes are delineated. The unpacked mask may be a dark-field mask based on the padding holes or a light-field mask based on the desired holes.

Yet another PAU method can be practiced as shown in FIGS. 5a through 5c. A single layer of negative resist is exposed with a light-field packed mask to be followed by a second exposure with a dark-field mask based on the padding holes or a light-field mask based on the desired holes. The area of the padding holes and the desired holes is unexposed after the first exposure. The second exposure exposes the padding holes to render them insoluble in the developer, resulting in a simple contact-hole image as shown.

PAU with insulating films is discussed next. Another means to implement PAU is to go through the normal hole delineation process using the packed mask following the sequence of exposure, development and etching. After this, both the desired holes and the padding holes are opened in an insulating layer of the integrated circuit. Only the desired holes can remain open. The padding holes have to be filled with insulating material. FIGS. 6a through 6c show the deposition of a subsequent insulating layer on the delineated insulting layer. The deposition can use any of the known methods such as chemical vapor deposition, sputter, or spin coating. With a photo sensitive insulating layer, this layer can simply be exposed with the unpacking mask and be developed to selectively remove the areas at the desired holes. With a non photo sensitive insulating film, another masking layer using a typical resist and the unpacking mask selectively removes the second insulating material from the desired hole area. In the latter case, the second insulating material must be compatible with the first insulating material so that the second insulating material can be cleanly removed from the first insulating material.

The location of the desired holes may not be ideal all the time. When the desired holes are placed off grid as shown in FIGS. 7a through 7c and 8a through 8c, alternating phase shifting is allocated as if the holes are on grid. A simple rule is to assign opposite phases to horizontally or vertically adjacent holes while keeping diagonally adjacent holes to the same phase. Padding holes are inserted at four sides of each desired hole as shown in FIGS. 9a through 9c. Four padding holes 93 similar in size but opposite in phase to desired hole 96 are placed at the four sides of 96 as shown in FIG. 9a. They are separated from hole 96 by a distance 107. FIG. 9a is a plot of the desired holes with the exception of the four padding holes for illustration purpose. The process of adding four holes to one desired hole continues until all desired holes are treated as shown in FIG. 9b. Notice that the padding holes may overlap each other irregularly as in clusters 98, 99, and 100 or they may overlap a desired hole as in cluster 101. Cluster 98 contains the padding holes to desired holes 96, 97 and 106. A single pattern 102 enclosing all three overlapping padding holes replaces them as shown in FIG. 9c. Clusters 99 and 100 are adjacent to each other. The former contains phase shifted padding holes and the latter un-shifted padding holes. Patterns 103 and 104 replace them, respectively. Cluster 101 contains a desired hole and a padding hole. The padding hole is simply removed. This process continues to the point where all clusters to produce the packed mask shown in FIGS. 7a through 7c and 8a through 8c have been created.

The invention, in view of the number of independent parameters that can be selected in the creation of the desired openings, involves a somewhat confusing thought process that can perhaps best be focused by a set of drawings, for this reason drawings FIGS. 8a through 8d are provided.

In viewing these drawings, the following must be realized:

the pattern 22 that is created in the first layer of photoresist, see FIG. 2a, is a base pattern that applies to all of these drawings a second layer of photoresist is deposited over the base pattern, see layer 26, FIG. 2b; this second layer of photoresist is patterned, creating an opening in this layer of photoresist that in all cases and by definition must align with the desired opening, that is opening 24, FIG. 2a.

Figure 10A:
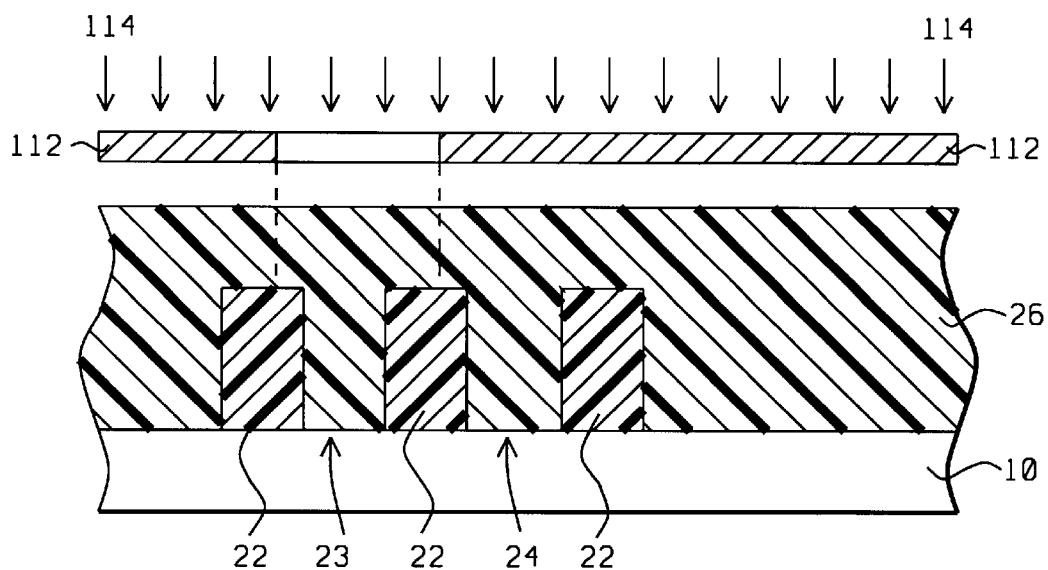
FIGS. 10a through 10d show combinations of layers of positive and negative photoresist and exposure masks.
Figure 10B:
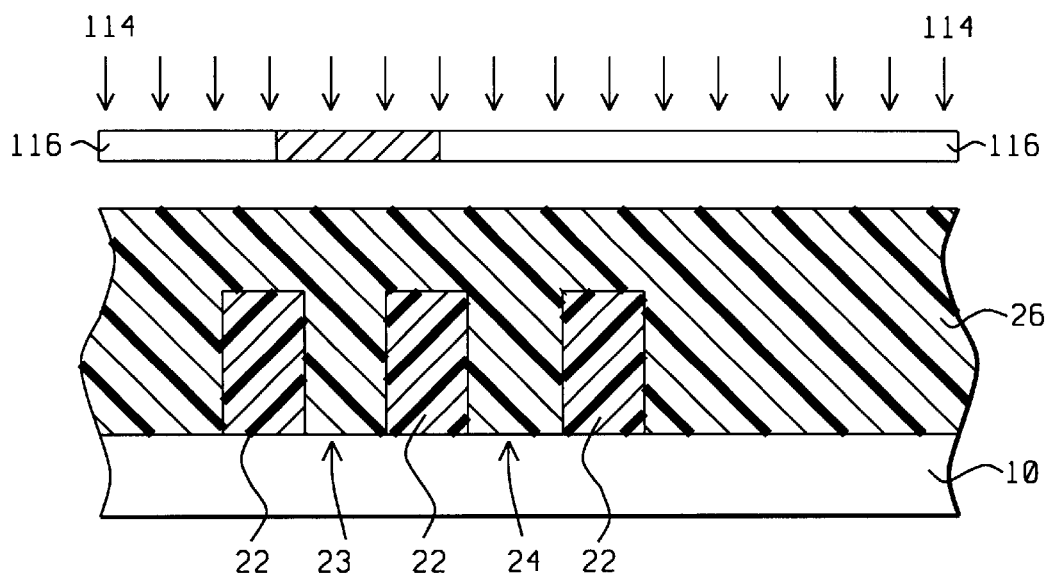

Using mask 12, FIG. 1a, where the unpacking features do not align with the desired holes but align with the padding holes, the second layer 26 of photoresist will only be removed from the desired holes under one of two conditions:

1. the second layer of photoresist is a negative layer of photoresist and the unpacking mask exposes (exposure 114) the padding holes, that is the unpacking features of the unpacking mask are transparent and the surrounding background surface of the unpacking mask is opaque; see FIG. 10a where layer 26 is a negative (second) layer of photoresist, mask 112 has an opening that aligns with the padding holes and does not align with the desired hole 24
2. the second layer of photoresist is a positive layer of photoresist and the unpacking mask does not expose the padding holes, that is the unpacking features of the unpacking mask are opaque and the surrounding background surface of the unpacking mask is transparent; see FIG. 10b where layer 26 is a positive (second) layer of photoresist, mask 116 is opaque in a surface area of the mask 119 that aligns with the padding holes and does not align with the desired hole 24.

Figure 10C:
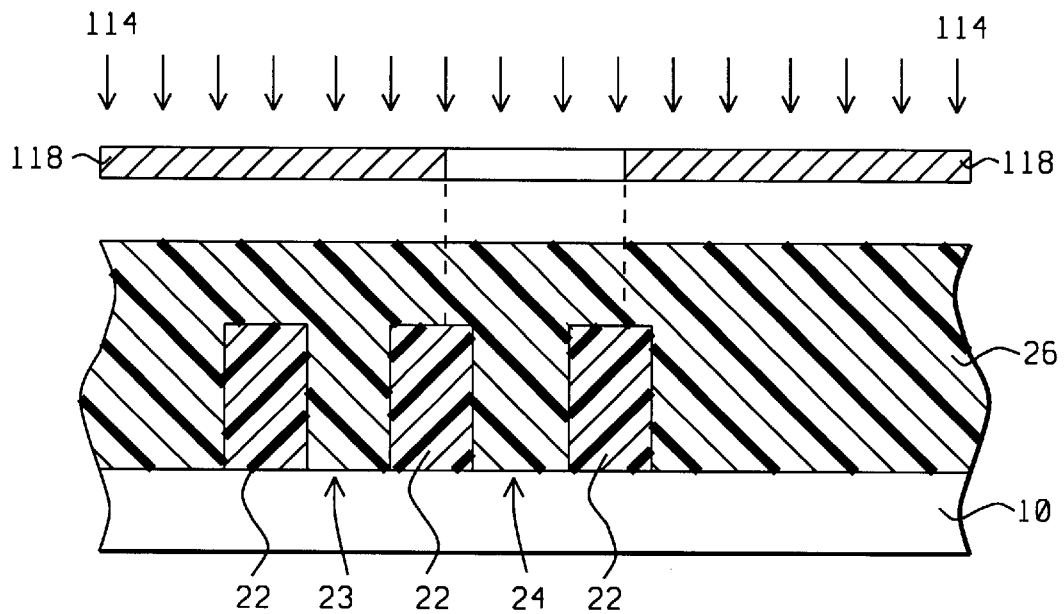
Figure 10D:
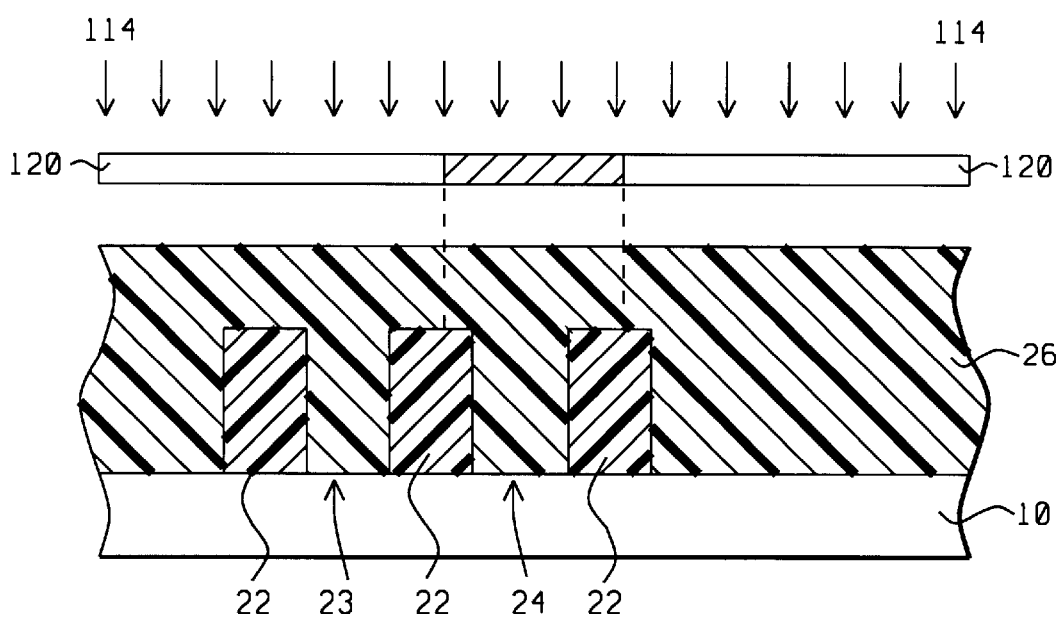

Using mask 32, FIG. 3b, where the unpacking features align with the desired holes and do not align with the padding holes, the second layer of photoresist will only be removed from the desired holes under one of two conditions:

1. the second layer of photoresist is a positive layer of photoresist and the unpacking mask exposes the desired holes, that is the unpacking features of the unpacking mask are transparent and the surrounding background surface of the unpacking mask is opaque; see FIG. 10c where layer 26 is a positive (second) layer of photoresist, mask 118 has an opening that aligns with the desired hole 24
2. the second layer of photoresist is a negative layer of photoresist and the unpacking does not expose the desired holes, that is the unpacking features of the unpacking mask are opaque and the surrounding background surface of the unpacking mask is transparent; see FIG. 10d where layer 26 is a negative (second) layer of photoresist, mask 120 is transparent in a surface area of the mask 130 that does not align with the desired hole 24.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating closely spaced contact holes, comprising the steps of:
   (1) providing a substrate, said substrate having been provided with a first layer of material for creation of a pattern of contact holes;
   (2) exposing the surface of said first layer of material with a first mask, said first mask comprising a first and a second pattern of contact holes, said first and said second pattern of contact holes being alternating in phase;
   (3) creating openings in said first layer of material in accordance with said first and second pattern of contact holes;
   (4) depositing a second layer of material over the surface of said first layer of material, including said openings created in said first layer of material in accordance with said first and second pattern of holes;
   (5) exposing the surface of said second layer of material with a mask selected from the group consisting of:
      (i) a second mask comprising a third pattern of holes, said third pattern of holes being aligned with said second pattern of holes, said third pattern of holes being a transparent pattern of holes with a surrounding opaque background surface;
      (ii) a third mask comprising a third pattern of holes, said third pattern of holes being aligned with said second pattern of holes, said third pattern of holes being an opaque pattern of holes with a surrounding transparent background surface;
      (iii) a fourth mask comprising a fourth pattern of holes, said fourth pattern of holes being aligned with said first pattern of holes, said fourth pattern of holes being a transparent pattern of holes with a surrounding opaque background surface;
      (iv) a fifth mask comprising a fourth pattern of holes, said fourth pattern of holes being aligned with said first pattern of holes, said fourth pattern of holes being an opaque pattern of holes with a surrounding transparent background surface; and
   (6) creating openings in said second layer of material in accordance with said third or fourth pattern of holes, holes of said third or fourth pattern of holes having a diameter being larger than a diameter of holes of said first and second pattern of holes by a measurable amount.

2. The method of claim 1, said first pattern of holes comprising contact holes.

3. The method of claim 1, said second pattern of holes comprising dummy holes.

4. The method of claim 1, wherein said creating openings in said second layer of material in accordance with said third or fourth pattern of holes comprises the steps of:
   selecting a negative photoresist for said second layer of material;
   providing said second mask;
   aligning said third pattern of holes provided in said second mask with said second pattern of holes created in said first layer of material;
   exposing the surface of said second layer of material in accordance with said third pattern of holes provided in said second mask; and
   developing said second layer of material in accordance with said third pattern of holes provided in said second mask.

5. The method of claim 1, wherein said creating openings in said second layer of material in accordance with said third or fourth pattern of holes comprises the steps of:
   selecting a positive photoresist for said second layer of material;
   providing said third mask;
   aligning said third pattern of holes provided in said third mask with said second pattern of holes created in said first layer of material;
   exposing the surface of said second layer of material in accordance with said third pattern of holes provided in said second mask; and
   developing said second layer of material in accordance with said third pattern of holes provided in said second mask.

6. The method of claim 1, wherein said creating openings in said second layer of material in accordance with said third or fourth pattern of holes comprises the steps of:
- selecting a positive photoresist for said second layer of material;
- providing said fourth mask;
- aligning said fourth pattern of holes provided in said fourth mask with said second pattern of holes created in said first layer of material;
- exposing the surface of said second layer of material in accordance with said fourth pattern of holes provided in said fourth mask; and
- developing said second layer of material in accordance with said fourth pattern of holes provided in said fourth mask.

7. The method of claim 1, wherein said creating openings in said second layer of material in accordance with said third or fourth pattern of holes comprises the steps of:
- selecting a negative photoresist for said second layer of material;
- providing said fifth mask;
- aligning said fourth pattern of holes provided in said fifth mask with said second pattern of holes created in said first layer of material;
- exposing the surface of said second layer of material in accordance with said fourth pattern of holes provided in said fifth mask; and
- developing said second layer of material in accordance with said fourth pattern of holes provided in said fifth mask.

8. The method of claim 1 wherein said first layer of material comprises photoresist.

9. The method of claim 1, said second layer of material comprising photoresist.

10. The method of claim 1, said first layer of material comprising an insulating material.

11. The method of claim 1, said second layer of material comprising a photo sensitive insulating material.

12. The method of claim 1, with an additional step of cross-linking said first layer of material.

13. The method of claim 1, with an additional step of hardening the surface of said first layer of material.

14. The method of claim 1, said holes of said second pattern being created by adding one additional hole to each side of holes of said first pattern.

15. The method of claim 14, said one additional hole being separated from said each side of holes of said first pattern by an equal distance.

16. The method of claim 15, said equal distance being within a range of between one time and two time the size of a largest cross section of said first hole.

17. The method of claim 14, said one additional hole having a cross section of a size about equal to a cross section of holes of said first pattern.

18. The method of claim 1 wherein overlapping holes of said second pattern of holes are combined into larger holes.

19. The method of claim 14, said one additional hole added to each side of holes of said first pattern being eliminated where said one additional hole overlaps holes of said first pattern of holes.

20. A method of creating closely spaced contact holes, comprising the steps of:
- providing a substrate, said substrate having been provided with a layer of dual-polarity resist for creation of a pattern of contact holes;
- exposing the surface of said layer of dual-polarity resist with a mask, said mask comprising a first and a second pattern of contact holes, said first and said second pattern of contact holes being alternating in phase, creating a first and a second pattern of exposure in said layer of dual-polarity resist;
- selectively exposing the surface of said layer of dual-polarity resist to a source of radiation, said selective exposure being in accordance with said second pattern of exposure in said layer of dual-polarity resist, thereby inhibiting creating openings in said layer of dual-polarity resist in accordance with said second pattern of exposure; and
- developing said layer of dual-polarity resist in accordance with said first pattern of exposure.

21. The method of claim 20, said first pattern of exposure comprising contact holes.

22. The method of claim 20, said second pattern of exposure comprising dummy holes.

23. A method of creating closely spaced contact holes, comprising the steps of:
- providing a substrate, said substrate having been provided with a layer of dual-polarity resist for creation of a pattern of contact holes;
- exposing the surface of said layer of photoresist with a mask, said mask comprising a first and a second pattern of contact holes, said first and said second pattern of contact holes being alternating in phase, creating a first and a second pattern of exposure in said layer of dual-polarity resist;
- selectively exposing the surface of said layer of photoresist to a source of radiation, said selective exposure being in accordance with said second pattern of exposure in said layer of dual-polarity resist, thereby hardening the surface of said layer of photoresist, inhibiting creating openings in said layer of photoresist in accordance with said second pattern of exposure; and
- developing said layer of photoresist in accordance with said first pattern of exposure.

24. The method of claim 23, said first pattern of holes comprising contact holes.

25. The method of claim 23, said second pattern of holes comprising dummy holes.

26. A packed mask for creating closely spaced contact holes, comprising:
- a first mask comprising a first and a second pattern of contact holes, said first and said second pattern of contact holes being alternating in phase;
- a second mask comprising a third pattern of holes, said third pattern of holes being aligned with said first pattern of holes, said third pattern of holes being a transparent pattern of holes with a surrounding opaque background surface.

27. The packed mask of claim 26, said first pattern of holes comprising contact holes.

28. The packed mask of claim 26, said second pattern of holes comprising dummy holes.

29. The packed mask of claim 26, said holes of said second pattern being created by adding one additional hole to each side of holes of said first pattern.

30. The packed mask of claim 29, said one additional hole being separated from said each side of holes of said first pattern by an equal distance.

31. The packed mask of claim 30, said equal distance being within a range of between one time and two time the size of a largest cross section of said first hole.

32. The packed mask of claim 30, said one additional hole having a cross section of a size about equal to a cross section of holes of said first pattern.

33. The packed mask of claim 26, overlapping holes of said second pattern of holes being combined into larger holes.

34. The packed mask of claim 26, said one additional hole added to each side of holes of said first pattern being eliminated where said one additional hole overlaps holes of said first pattern of holes.

35. A packed mask for creating closely spaced contact holes, comprising:
- a first mask comprising a first and a second pattern of contact holes, said first and said second pattern of contact holes being alternating in phase;
- a third mask comprising a third pattern of holes, said third pattern of holes being aligned with said first pattern of holes, said third pattern of holes being an opaque pattern of holes with a surrounding transparent background surface.

36. The packed mask of claim 35, said first pattern of holes comprising contact holes.

37. The packed mask of claim 35, said second pattern of holes comprising dummy holes.

38. The packed mask of claim 35, said holes of said second pattern being created by adding one additional hole to each side of holes of said first pattern.

39. The packed mask of claim 38, said one additional hole being separated from said each side of holes of said first pattern by an equal distance.

40. The packed mask of claim 39, said equal distance being within a range of between one time and two time the size of a largest cross section of said first hole.

41. The packed mask of claim 38, said one additional hole having a cross section of a size about equal to a cross section of holes of said first pattern.

42. The packed mask of claim 35, overlapping holes of said second pattern of holes being combined into larger holes.

43. The packed mask of claim 38, said one additional hole added to each side of holes of said first pattern being eliminated where said one additional hole overlaps holes of said first pattern of holes.

44. A packed mask for creating closely spaced contact holes, comprising:
- a first mask comprising a first and a second pattern of contact holes, said first and said second pattern of contact holes being alternating in phase;
- a fourth mask comprising a fourth pattern of holes, said fourth pattern of holes being aligned with said second pattern of holes, said fourth pattern of holes being transparent pattern of holes with a surrounding opaque background surface.

45. The packed mask of claim 44, said first pattern of holes comprising dummy holes.

46. The packed mask of claim 44, said second pattern of holes comprising contact holes.

47. The packed mask of claim 44, said holes of said second pattern being created by adding one additional hole to each side of holes of said first pattern.

48. The packed mask of claim 47, said one additional hole being separated from said each side of holes of said first pattern by an equal distance.

49. The packed mask of claim 48, said equal distance being within a range of between one time and two time the size of a largest cross section of said first hole.

50. The packed mask of claim 47, said one additional hole having a cross section of a size equal to a cross section of holes of said first pattern.

51. The packed mask of claim 44, overlapping holes of said second pattern of holes being combined into larger holes.

52. The packed mask of claim 47, said one additional hole added to each side of holes of said first pattern being eliminated where said one additional hole overlaps holes of said first pattern of holes.

53. A packed mask for creating closely spaced contact holes, comprising:
- a first mask comprising a first and a second pattern of contact holes, said first and said second pattern of contact holes being alternating in phase;
- a fifth mask comprising a fourth pattern of holes, said fourth pattern of holes being aligned with said second pattern of holes, said fourth pattern of holes being an opaque pattern of holes with a surrounding transparent background surface.

54. The packed mask of claim 53, said first pattern of holes comprising dummy holes.

55. The packed mask of claim 53, said second pattern of holes comprising contact holes.

56. The packed mask of claim 54, said holes of said second pattern being created by adding one additional hole to each side of holes of said first pattern.

57. The packed mask of claim 56, said one additional hole being separated from said each side of holes of said first pattern by an equal distance.

58. The packed mask of claim 57, said equal distance being within a range of between one time and two time the size of a largest cross section of said first hole.

59. The packed mask of claim 56, said one additional hole having a cross section of a size about equal to a cross section of holes of said first pattern.

60. The packed mask of claim 53, overlapping holes of said second pattern of holes being combined into larger holes.

61. The packed mask of claim 56, said one additional hole added to each side of holes of said first pattern being eliminated where said one additional hole overlaps holes of said first pattern of holes.

* * * * *